United States Patent [19]
Häussling et al.

[11] Patent Number: 5,683,833
[45] Date of Patent: Nov. 4, 1997

[54] USE OF ORGANIC MATERIALS HAVING HIGH NONIONIC CHARGE CARRIER MOBILITY

[75] Inventors: Lukas Häussling, Bad Dürkheim; Karl-Heinz Etzbach; Karl Siemensmeyer, both of Frankenthal; Wolfgang Paulus, Weisenheim; Dieter Meissner; Christina Antonius, both of Hanover; Karsten Engel, Bremen; Dietrich Haarer, Bayreuth; Sundeep Kumar; Peter Schuhmacher, both of Mainz, all of Germany

[73] Assignee: BASF Aktiengesellschaft, Ludwigshafen, Germany

[21] Appl. No.: 574,428

[22] Filed: Dec. 15, 1995

[30] Foreign Application Priority Data

Dec. 20, 1994 [DE] Germany ............ 44 45 584.4

[51] Int. Cl.⁶ ............................................. H01M 10/40
[52] U.S. Cl. ............................................. 429/192; 136/263
[58] Field of Search ............................ 429/192, 213; 136/263

[56] References Cited

U.S. PATENT DOCUMENTS

| | | | |
|---|---|---|---|
| 4,550,067 | 10/1985 | Horiba et al. | 429/213 |
| 4,584,251 | 4/1986 | Hunziker | 429/213 X |
| 4,948,688 | 8/1990 | Kitatani et al. | 136/263 X |
| 5,393,626 | 2/1995 | Closs et al. | 430/56 |

FOREIGN PATENT DOCUMENTS

| | | |
|---|---|---|
| 0 527 376 | 2/1993 | European Pat. Off. |
| 42 07 659 | 9/1993 | Germany |
| 43 39 711 | 5/1995 | Germany |
| WO94/05045 | 3/1994 | WIPO |

OTHER PUBLICATIONS

Physical Review Letters, vol. 70, No. 4, Jan. 25, 1993, pp. 457–460, D. Adam, et al., "Transient Photoconductivity in a Discotic Liquid Crystal".

Journal of the Chinese Chemical Society, vol. 40, 1993, pp. 321–327, Marye Anne Fox, et al., "Functionalized Porphyrin discotic Liquid Crystals: Photoinduced Charge Separation and Trapping".

Photochemical Processes in Organized Molecular Systems, 1991, pp. 359–376, Marye Anne Fox, et al., "Synthetic Design of Liquid Crystals for Directional Electron Transport".

*Primary Examiner*—Stephen Kalafut
*Attorney, Agent, or Firm*—Oblon, Spivak, McClelland, Maier & Neustadt, P.C.

[57] ABSTRACT

Disclosed the use of organic materials having a specific conductivity of less than $10^{-2}$ S/cm and a nonionic charge carrier mobility greater than $10^{-4}$ cm$^2$/Vs as charge transport medium, with the proviso that an increase in the charge carrier concentration by a factor of 10 or more is not caused in this organic material by light absorption, and corresponding electrochemical cells.

22 Claims, No Drawings

USE OF ORGANIC MATERIALS HAVING HIGH NONIONIC CHARGE CARRIER MOBILITY

The present invention relates to the use of organic materials having low electroconductivity but high nonionic charge carrier mobility, as charge transport media.

EP-A-0 527 376, of which U.S. 5,393,626 is an English language counterpart, describes low-molecular-weight and polymeric organic photoconductors having generally discotic liquid-crystalline properties and increased photoconductivity. A typical representative is hexaalkoxytriphenylene, which has a charge carrier mobility of almost $10^{-3}$ cm$^2$/Vs (cf. D. Adam, F. Closs, T. Frey, D. Funhoff, D. Haarer, H. Ringsdorf, R. Schuhmacher, K. Siemensmeyer, Phys. Rev. Lett., 70 (1993) 457).

The article "Functionalized Porphyrin Discotic Liquid Crystals: Photoinduced Charge separation and Trapping" by Marye Anne Fox, Allen J. Bard, Horng-Long Pan and Chong-Yang Liu in Journal of the Chinese Chemical Society, 40 (1993) 321–327, states that individual members of a family of highly absorbent porphyrins which contain symmetrically arranged flexible side groups form discotic liquid-crystalline mesophases at moderate temperatures. The arrangement of these phases is maintained when a layer of this material is cooled to room temperature. If such films are exposed to visible radiation in the presence or absence of an electric field, photovoltaic effects occur.

The article "Synthetic Design of Liquid Crystals for Directional Electron Transport" by Marye Anne Fox and Horng-Long Pan in Photochemical processes in Organized Molecular Systems, 1991, 359–376, describes the production of a solid-state photovoltaic cell comprising a thin film of an organic semiconductor arranged between indium tin oxide electrodes.

In the above cases, an increase in the charge carrier concentration achieved by light absorption is necessary in order to achieve adequate conductivity.

WO-A-94/05045 describes heterocontacts comprising conjugated polymers and acceptors, diodes, photodiodes and photovoltaic cells, where, for example, fullerenes, in particular buckminster-fullerene, $C_{60}$, are employed. German Patent Application P 43 39 711.5 describes novel triphenylene compounds and processes for the preparation of crosslinked, discotic, liquid-crystalline polymers.

As charge transport medium in electrochemical cells, the charge transport has hitherto been effected by mobile ions which must have an adequate diffusion rate. In electronics components, the charge transport media employed hitherto have been inorganic semiconductors or organic polymers or oligomers with a sufficiently high charge carrier concentration due to doping or photoexcitation. The only components having a charge transport medium of low conductivity which are interesting for practical applications are photovoltaic cells, in which intrinsic inorganic or organic semiconductors are rendered conductive through photoexcitation, or in which an inorganic high-resistance semiconductor is used for charge transport after dye sensitization. High-resistance organic materials which effect charge transport on their own have not been disclosed hitherto.

It is an object of the present invention to provide organic materials which do not have the disadvantages outlined above.

We have found that this object is achieved by the use of organic materials having a specific conductivity of less than $10^{-2}$ S/cm and a nonionic charge carrier mobility of greater than $10^{-4}$ cm$^2$/Vs as charge transport medium, with the proviso that an increase in the charge carrier concentration by a factor of 10 or more is not caused in this organic material by light absorption.

The present invention also provides electrochemical cells containing at least one charge transport medium and at least two electrodes, in which the charge transport medium comprises or consists of an organic material having a specific conductivity of less than $10^{-2}$ S/cm and a nonionic charge carrier mobility of greater than $10^{-4}$ cm$^2$/Vs, with the exception of electrochemical cells containing hexapentyloxytriphenylene or hexahexylthiotriphenylene as charge transport medium and containing transparent glass plates with an electroconductive coating as electrodes.

The novel use of organic materials having a specific conductivity of less than $10^{-2}$ S/cm and a nonionic charge carrier mobility of greater than $10^{-4}$ cm$^2$/Vs as charge transport medium generally includes replacement of the electrolyte in electrochemical systems (for example electrical energy storage systems) and in particular as charge transport medium in electrochemical cells or electronic components.

Particular preference is given to their use in photoelectrochemical cells, in particular those containing a dye molecule embedded between two insulators. The insulators have energy states which enable the transport of charges, on the one hand of electrons in unoccupied states, and on the other hand of holes in occupied electronic energy states.

The electrodes or contact materials generally comprise metals, semimetals or semiconductors whose energy states and work functions enable charge transfer into the energy states provided for transport by the novel charge transport medium. The resultant contacts can have ohmic or rectifying current-voltage behavior, depending on their intended application. The contacting result in the formation of heterocontacts.

It is preferred according to the invention for one electrode (in general the semiconductor electrode) to have a nanocrystalline or fractal surface, as is preferably produced with the aid of sol/gel processes (for example "rough $TiO_2$").

In a preferred embodiment of the invention, the organic materials having a specific conductivity of less than $10^{-2}$ S/cm and a non-ionic charge carrier mobility of greater than $10^{-4}$ cm$^2$/Vs are used as charge transport medium for charge carriers formed by exposing a dye (in sensitization-type solar cells, as described, for example, in DE-A-42 07 659) or an inorganic rectifying contact (in solid-state photovoltaics).

Accordingly, preference is given in accordance with the invention to electrochemical cells in which at least one of the electrodes comprises a rectifying semiconductor and/or is coated with a dye.

By contrast, indium tin oxide, with which glass plates are frequently coated to give electroconductivity, is a degenerate semiconductor which has no rectifying properties.

For the purposes of the present invention, electrochemical cells are, for example, batteries or accumulators, fuel cells, electrolyzers and galvanic cells.

For the purposes of the present invention, electronics components are in the broadest sense components in electronics, optoelectronics and/or molecular information storage and recording in which organic compounds having a specific conductivity of less than $10^{-2}$ S/cm and a nonionic charge carrier mobility of greater than $10^{-4}$ cm$^2$/Vs are employed according to the invention as contact and window material for heterocontacts, metal replacement in Schottky contacts, p- and n-semiconducting material or as organic electrolyte replacement.

In particular, an organic material having liquid-crystalline properties is employed in accordance with the invention. Besides calamitic liquid-crystalline compounds, discotic liquid-crystalline compounds are particularly suitable.

Preference is given to organic materials having liquid-crystalline properties from the group consisting of unsubstituted and substituted triphenylenes, phthalocyanines, hexasubstituted benzenes, truxenes, hexa- and octasubstituted dibenzopyrenes and oligothiophenes.

Of these, particular preference is given to alkoxy- and thioalkyl-substituted triphenylenes and mixtures thereof, phthalocyanines, hexasubstituted benzenes, truxenes and hexa- and octasubstituted dibenzopyrenes, in particular alkoxy- and thioalkylsubstituted triphenylenes and mixtures thereof and hexa- and octasubstituted dibenzopyrenes.

A particularly preferred embodiment of the invention uses alkoxy-or thioalkyl-substituted triphenylenes or mixtures thereof. A very particularly preferred embodiment uses alkoxylated triphenylenes.

These organic materials are known per se (cf. German Patent Application P 43 39 711.5 and EP-A-0 527 376, and the references cited therein).

The novel use generally takes place in the form of thin coatings having a thickness of from $10^{-9}$ to $10^{-3}$ m. The coatings are preferably applied by vapor deposition, spin coating, knife coating, brushing or screen printing or are introduced, for example, into a cell arrangement by melting. In order to achieve the desired charge carrier mobilities, an alignment of the molecules is generally produced at above room temperature and is then frozen by slow cooling to the working temperature. Through suitable overlapping of energy states, the alignment on the molecules then provides conduction paths for charge carriers in which the latter then have an adequate mobility of, preferably, greater than $10^{-3}$ cm$^2$/Vs.

The charge carriers necessary for charge carrier transport are then themselves generally injected at least partly from the contact materials into the material and improve the conductivity of the organic material.

In a preferred embodiment of the novel electrochemical cell, the electrolyte comprises the organic material having a specific conductivity of less than $10^{-2}$ S/cm and a nonionic charge carrier mobility of greater than $10^{-4}$ cm$^2$/Vs.

Further compounds or elements can be admixed with the charge transport medium, allowing further functionalization of the organic material itself. This includes, in particular, sensitization by light-absorbing substances, doping with electron acceptors or donors or the addition of reactive compounds whose properties sensitize the charge transport medium for substances which can be detected and measured in an intended sensor action.

The invention has numerous advantages. In the novel use, the production of charge carriers by charge carrier generation on absorption of light (photoionization) is not absolutely necessary. In addition, very simple contact production is possible. This can in principle be done at low temperatures. Passivation of the surfaces is simple, and the formation of defects during contacting is avoided. Furthermore, recombination losses with charged carriers in different bands generally do not occur. In addition, self-alignment with adaptation to non-planar surfaces can take place.

Furthermore, the use of organic compounds is associated with great variability in production of various band layers which allows targeted optimization of the overlapping of energy states to interfaces and contacts. This also allows adaptation of orbital layers of charge-carrier-generating and -transporting media.

In the novel use as charge transport medium for replacement of, for example, ionic electrolytes, the use of liquids which are difficult to handle industrially can be avoided. In addition, there is no need to search for ion-forming salts which have adequate solubility in the electrolyte, but which do not themselves participate in the charge transfer. Depending on the application, the use of redox systems which ensure charge transfer to the electrodes can also be avoided wholly or partly.

Furthermore, a change in the charge carrier mobility at defined temperatures, which occurs through phase conversions, can be utilized for switching processes.

Moreover, the novel organic materials have the advantage of extreme chemical and physical variability, which allows specific synthesis with respect to the properties required in each case. In addition, they have the advantage that, through targeted use of their various phase states (crystalline, liquid-crystalline, liquid and gaseous), in which the composition can remain unchanged, very simple construction of electrochemical cells and use of low production temperatures and inexpensive methods is possible. By contrast, only ion-conducting materials have hitherto been employed as charge transport medium (also referred to as electrolyte). Owing to their high charge carrier mobility, the novel organic materials can even dissipate charges in non-ionic forms of contact materials or electrodes without themselves needing to have a high charge carrier concentration, either intrinsically, through doping or after photoexcitation. It is thus now possible to employ materials which have high resistances without externally injected charges.

The examples below illustrate the invention.

EXAMPLES

Example 1

Inorganic/organic Solar Cell

An arrangement of n-GaAs and a contact electrode made from ITO/glass or glass coated with metal by vapor deposition, which are spatially separated by a spacer film, was fixed by means of an adhesive (Torr-Seal$^R$, Varian) and sealed on three sides. Liquid-crystalline hexapentyloxytriphenylene (HPT) in powder form was applied to the open side. In order to produce the charge transport medium, the arrangement was heated to the melting point of the HPT. The HPT then flowed into the gap between the two electrodes. On cooling, the HPT passed through the liquid-crystalline phase. HPT has a specific conductivity of less than $10^{-5}$ S/cm and a nonionic charge carrier mobility of $10^{-3}$ cm$^2$/Vs.

On exposure of the arrangement, charge carriers were produced in the inorganic n-conducting semiconductor material and separated in this material. The holes reaching the interface with the organic charge transport medium were injected into this material and transported thereby to the countercontact, the ITO/glass. On exposure to the light from a 450 W xenon lamp, a photovoltage ($U_{oc}$) was generated between the two electrodes, as would also have been expected on use of a liquid ion-conducting electrolyte instead of the organic charge transport medium. This was also the case when direct light absorption by the HPT was prevented by using a 400 nm cut-off filter (UV filter). Representative results are shown in Table 1. Connection of the two electrodes resulted in the photocurrent shown in Table 2. The results shown in Tables 1 and 2 indicate that the photovoltage rose with the logarithm of the light intensity and the photocurrent rose linearly with the light intensity.

The output characteristics of the photovoltaic cells are shown in Table 3. Output characteristics typical of photovoltaic cells were obtained, with a maximum power point (MPP), even in the unoptimized arrangement, of about 75% of the no-load voltage and about 40 % of the short-circuit current.

The temperature dependence of the short-circuit photocurrents measured in the cell is shown in Table 4. The temperature dependence reflects the effect of the molecular alignment and thus the overlapping of the energy states of the highest occupied molecule level which are responsible for current transport. A significant increase in the photocurrent was observed on transition into the liquid-crystalline phase of the HPT between 60° and 90° C.

TABLE 1

| Light intensity/a.u. | Photovoltage/mV |
|---|---|
| 100 | 690 |
| 10 | 520 |
| 0.1 | 380 |

TABLE 2

| Light intensity/a.u. | Photocurrent/nA | Photocurrent n/A with UV filter (400 nm) |
|---|---|---|
| 0.01 | 7.9 | 1.75 |
| 0.1 | 47.5 | 2.9 |
| 0.2512 | 105 | 4.15 |
| 0.5012 | 180 | 6.0 |
| 1 | 324–390 | 17.8 |

TABLE 3

| Tapped voltage V | Photocurrent used n/A | Power produced n/W |
|---|---|---|
| 0 | 382 | 0 |
| −50 | 319 | 15.95 |
| −100 | 274 | 27.4 |
| −150 | 241 | 36.15 |
| −200 | 217 | 43.4 |
| −300 | 183 | 54.9 |
| −400 | 152 | 60.8 |
| −500 | 96 | 48.0 |
| −592 | 0 | 0 |

TABLE 4

| Temperature/°C. | Photocurrent n/A |
|---|---|
| 37 | 3.4 |
| 42 | 5.5 |
| 48 | 9.5 |
| 55 | 16.8 |
| 62.5 | 100 |
| 69 | 230 |
| 76 | 295 |
| 93 | 411 |
| 107 | 460 |

Example 2

Sensitization-type Solar Cell

A derivatized tris(bipyridyl)ruthenium dye was bonded to a $TiO_2$ surface by immersion in a solution of this dye. This electrode was then contacted with HPT coating as described under Example 1. Table 5 shows the photocurrents measured at various wavelengths on use of interference filters.

To simplify comparability, the values measured were standardized to the highest values. The spectral behavior of the photocurrent "reproduced" the spectrum of the excited dye. The absolute photocurrents were in the order of 1 nA.

Based on the incident light, less than 1% of which was absorbable by the active dye monolayer, this corresponds to an apparent quantum yield of about 0.3%.

Example 3

A solar cell was constructed as described in Example 2, but the $TiO_2$ contact layer on the ITO electrode was applied to the ITO electrode as colloidal $TiO_2$ by the sol-gel process by repeated immersion. In this way, fully blocking characteristic lines were measured from a number of 3 to 4 layers. The solar cell with colloidal $TiO_2$ contact exhibited better photocurrents over a few hours on illumination with white light than did the cell having a crystalline $TiO_2$ contact.

Comparative Example

The procedure was as described under Example 2, but the HPT layer was replaced as electrolyte by an iodide solution (0.5M at pH 2.5, adjusted using $HClO_4$). The photocurrents measured and the quantum yield are shown in Table 5, where, for simpler comparability, the values measured have been standardized to the highest values. The absolute monochromatic photocurrents were in the order of 1 nA. The spectral behavior of the photocurrent "reproduced" the spectrum of the dye.

The results in Table 5 confirm that a liquid ion-conducting electrolyte, which may also contain a redox system for photovoltaic applications, can be replaced in full by the novel charge transport medium.

The photovoltages of a few hundred mV achieved were likewise comparable.

TABLE 5

| Wavelength nm | Quantum yield | Photocurrent a.u. | Photocurrent a.u. |
|---|---|---|---|
| 450 | 100 | 100 | 100 |
| 525 | 103 | 96 | 95 |
| 550 | 79 | 52 | 75 |
| 600 | 31 | 35 | 60 |
| 700 | 3 | 0 | 30 |

We claim:

1. A method of transporting charge carriers from a charge carrier generating medium to a charge carrier receiving medium comprising transporting the charge carriers via an organic, charge transporting material, said material having a specific conductivity of less than $10^{-2}$ S/cm and a nonionic charge carrier mobility of greater than $10^{-4}$ cm$^2$/Vs when used as a charge transport medium, with the proviso that an increase in the charge carrier concentration by a factor of 10 or more is not caused in said organic, charge transporting material by light absorption.

2. A method as claimed in claim 1, wherein the organic material has liquid-crystalline properties.

3. A method as claimed in claim 2, wherein the organic material having liquid-crystalline properties is selected from the group consisting of substituted and unsubstituted triphenylenes, phthalocyanines, hexasubstituted benzenes, truxenes, hexa- and octasubstituted dibenzopyrenes and oligothiophenes.

4. A method as claimed in claim 1, wherein the charge transport medium is used in an electrochemical cell or an electronic component.

5. A method as claimed in claim 4, wherein the charge transport medium constitutes the electrolyte of a photoelectrochemical cell.

6. A method as claimed in claim 2, wherein the organic material is solid at room temperature.

7. A method as claimed in claim 3, wherein the organic material is selected from the group consisting of alkoxy- and thioalkyl-substituted triphenylenes.

8. The method of claim 6, wherein said organic material having liquid-crystalline properties material is hexapentyloxytriphenylene.

9. A method as set forth in claim 2, wherein the organic material having liquid-crystalline properties is at a temperature at which it is the liquid-crystalline phase.

10. An electrochemical cell comprising at least one charge transport medium, which functions as the cell's electrolyte, and at least two electrodes, wherein the electrolyte forming the charge transport medium comprises an organic material having a specific conductivity of less than $10^{-2}$ S/cm and a nonionic charge carrier mobility of greater than $10^{-4}$ cm$^2$/Vs, with the exception of electrochemical cells containing hexapentyloxytriphenylene or hexahexylthiotriphenylene as charge transport medium and containing transparent glass plates with an electroconductive coating as electrodes.

11. An electrochemical cell as claimed in claim 10, wherein the electrolyte consists of the organic material.

12. An electrochemical cell as claimed in claim 10, wherein the organic material has liquid-crystalline properties.

13. An electrochemical cell as claimed in claim 12, wherein the organic material having liquid-crystalline properties is selected from the group consisting of substituted and unsubstituted triphenylenes, phthalocyanines, hexasubstituted benzenes, truxenes, hexa- and octasubstituted dibenzopyrenes and oligothiophenes.

14. An electrochemical cell as claimed in claim 13, wherein the organic material is selected from the group consisting of alkoxy- and thioalkyl-substituted triphenylenes and mixtures thereof, phthalocyanines, hexasubstituted benzenes, truxenes and hexa- and octasubstituted dibenzopyrenes.

15. An electrochemical cell as claimed in claim 10, wherein at least one of the electrodes comprises a rectifying semiconductor and/or is coated with a dye.

16. An electrochemical cell as claimed in claim 10, which is a photoelectrochemical cell.

17. An electrochemical cell as claimed in claim 12, wherein the electrolyte consists essentially of said organic material.

18. An electrochemical cell as claimed in claim 12, wherein the electrolyte consists of said organic material.

19. An electrochemical cell as set forth in claim 12, wherein a said organic material having liquid-crystalline properties is selected from the group consisting of alkoxy- and thioalkyl-substituted triphenylenes and mixtures thereof.

20. An electrochemical cell as claimed in claim 12, wherein said organic material having liquid-crystalline properties is hexapentyloxytriphenylene.

21. An electrochemical cell as claimed in claim 15, wherein at least one of the electrodes comprises a rectifying semiconductor.

22. A photoelectrochemical cell as set forth in claim 16, wherein one of the electrodes comprises a nanocrystalline or fractal surface of rough TiO$_2$ produced with the aid of a sol/gel process.

* * * * *